United States Patent
Ouyang et al.

(10) Patent No.: US 8,446,531 B2
(45) Date of Patent: May 21, 2013

(54) SYSTEM AND METHOD FOR CLOCK OFFSET DETECTION

(75) Inventors: Bing Ouyang, Plano, TX (US); John Michael Hayden, Allen, TX (US); Troy Lane Ethridge, Bedford, TX (US); Hong Jin Cho, Allen, TX (US); Jeff Kordel, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1227 days.

(21) Appl. No.: 12/170,198

(22) Filed: Jul. 9, 2008

(65) Prior Publication Data

US 2010/0007795 A1 Jan. 14, 2010

(51) Int. Cl.
*H03M 1/12* (2006.01)
*H03L 7/00* (2006.01)

(52) U.S. Cl.
USPC .......................................... 348/572; 348/537

(58) Field of Classification Search
None
See application file for complete search history.

(56) References Cited

U.S. PATENT DOCUMENTS

| | | | |
|---|---|---|---|
| 4,654,708 A | 3/1987 | de la Guardia et al. | |
| 5,732,113 A * | 3/1998 | Schmidl et al. | 375/355 |
| 5,767,916 A | 6/1998 | West | |
| 5,805,233 A | 9/1998 | West | |
| 5,818,544 A * | 10/1998 | Han | 348/725 |
| 6,040,871 A * | 3/2000 | Andersson | 348/510 |
| 6,502,045 B1 * | 12/2002 | Biagiotti | 702/66 |
| 6,522,365 B1 | 2/2003 | Levantovsky et al. | |
| 7,024,575 B2 * | 4/2006 | Lienhart et al. | 713/400 |
| 7,277,503 B2 * | 10/2007 | Huang et al. | 375/327 |
| 7,460,991 B2 * | 12/2008 | Jones et al. | 704/211 |
| 8,330,873 B2 * | 12/2012 | Silver et al. | 348/731 |
| 2003/0112911 A1 * | 6/2003 | Barton et al. | 375/365 |
| 2006/0274194 A1 * | 12/2006 | Ouyang et al. | 348/441 |
| 2006/0274207 A1 | 12/2006 | Hayden et al. | |
| 2007/0182443 A1 * | 8/2007 | Funada | 324/770 |
| 2008/0225176 A1 * | 9/2008 | Selby et al. | 348/572 |

OTHER PUBLICATIONS

"Autolock Enhancements—Timing Rule: Autolock Algorithm White Paper: Draft 1," DDP2230 Component: DLP® FP Tutorial Library, Mar. 31, 2008, pp. 1-12, Texas Instruments, Dallas, TX.
Rabiner, L.R., "On the Use of Autocorrelation Analysis for Pitch Detection," IEEE Transactions on Acoustics, Speech and Signal Processing, Feb. 1977, pp. 24-33, vol. ASSP-25, No. 1, IEEE, Los Alamitos, CA.
Ross, M.J., et al., "Average Magnitude Difference Function Pitch Extractor," IEEE Transactions on Acoustics, Speech and Signal Processing, Oct. 1974, pp. 353-362, vol. ASSP-22, No. 5, IEEE, Los Alamitos, CA.

* cited by examiner

*Primary Examiner* — Brian Pendleton
*Assistant Examiner* — Jonathan V Lewis
(74) *Attorney, Agent, or Firm* — Warren L. Franz; Wade J. Brady, III; Frederick J. Telecky, Jr.

(57) ABSTRACT

A system and method for detecting a sampling clock offset of an analog-to-digital converter used to digitize an analog image signal. A method comprises buffering samples of an analog image signal, computing a value of an autocorrelation function using the buffered samples and a delayed version of the buffered samples, and repeating the computing a value for delays in a range of delays. The method also comprises computing a sampling frequency offset from the values of the autocorrelation function and changing a sampling frequency using the sampling frequency offset.

16 Claims, 13 Drawing Sheets

SYSTEM AND METHOD FOR CLOCK OFFSET DETECTION

CROSS-REFERENCE TO RELATED APPLICATION

This application is related to the following co-assigned patent applications: U.S. Patent Publication Number 2006/0274194 A1, filed Feb. 16, 2006, entitled "Method and Apparatus for Analog Graphics Sample Clock Frequency Offset Detection and Verification," Ser. No. 12/101,685, filed Apr. 11, 2008, entitled "System and Method for Detecting a Sampling Frequency of an Analog Video Signal," Ser. No. 12/172,360, filed Jul. 14, 2008, entitled "System and Method for Tuning a Sampling Frequency," which applications are hereby incorporated herein by reference.

TECHNICAL FIELD

The present invention relates generally to a system and method for displaying images, and more particularly to a system and method for detecting a sampling clock offset of an analog-to-digital converter used to digitize an analog image signal.

BACKGROUND

In many modern image display systems, image frames of an analog image signal, such as analog video, analog computer graphics, analog DVDs, analog game console output, and so forth, may be digitized prior to being displayed. Digitizing the image frames of the analog image signal may enable processing of the image frames by image processing hardware in the image display system. The processing performed by the image processing hardware may improve image quality, reduce image noise, enhance desired properties of the image, deemphasize undesired properties of the image, and so on, for example.

The digitizing may include sampling the analog image signal without prior knowledge of a sampling frequency or sampling phase using an analog to digital converter (ADC). In order to properly digitize the images in the analog image signal, a sampling frequency generally must be detected. If the sampling frequency is incorrectly detected, then when the digitized images are displayed, the resulting images may be distorted at best or completely incomprehensible at worse.

In order to correctly detect the sampling frequency, a sampling frequency offset may need to be detected. The sampling frequency offset generally is an offset between an actual sampling frequency of the analog image signal and a sampling frequency of a sampling clock used to time the digitizing of the analog image signal. The presence of a sampling frequency offset may result in the appearance of a vertical interference pattern on images displayed by the image display system. FIG. 1a illustrates an image frame 100 from an analog image signal. The image frame 100 includes a light grey background. FIG. 1b illustrates a displayed image frame 150. The image frame 150 may be representative of the image frame 100 sampled with an incorrect sampling frequency (with a non-zero sampling frequency offset). The non-zero sampling frequency offset may create an aliasing effect that is visible on the displayed image frame 150 as a vertical interference pattern. The vertical interference pattern may include vertical bars, such as vertical bars 155 and 156.

A period of the vertical bars, such as a period between the vertical bars 155 and 156 shown as interval 160, in the vertical interference pattern may be inversely proportional to the non-zero sampling frequency offset. It may be possible to determine the non-zero sampling frequency offset by measuring the period of the vertical bars. Please refer to a co-assigned U.S. patent application entitled "Method and Apparatus for Analog Graphics Sample Clock Frequency Offset Detection and Verification," U.S. Patent Publication Number 2006/0274194 A1, filed Feb. 16, 2006, which patent application is hereby incorporated herein by reference, for a detailed discussion of the determination of the sampling frequency offset from the period of the vertical interference pattern.

SUMMARY OF THE INVENTION

These and other problems are generally solved or circumvented, and technical advantages are generally achieved, by embodiments of a system and a method for detecting a sampling clock offset of an analog to digital converter used to digitize an analog image signal.

In accordance with an embodiment, a method for adjusting a sampling frequency of an analog-to-digital converter (ADC) is provided. The method includes buffering samples of an analog image signal, computing a value of an autocorrelation function using the buffered samples and a delayed version of the buffered samples, repeating the computing a value of an autocorrelation function for delays in a range of delays, computing a sampling frequency offset from the values of the autocorrelation function, and changing the sampling frequency of the ADC using the sampling frequency offset.

In accordance with another embodiment, a method for displaying images from an analog image signal is provided. The method includes determining a sampling frequency for the analog image signal, sampling the analog image signal at the sampling frequency to produce first samples, computing a set of first values of an autocorrelation function with the first samples and a delayed version of the first samples for a range of delays, and computing the sampling frequency offset from a non-zero delay value corresponding to a first minima of the set of first values associated with a non-zero delay. The method also includes adjusting the sampling frequency in response to determining that there is a sampling frequency offset, sampling the analog image signal at the adjusted sampling frequency to produce second samples, image processing the second samples, and displaying the processed second samples.

In accordance with another embodiment, a display system is provided. The display system includes a display that produces images by modulating light based on image data, an image input providing an analog image signal comprising the image data, an image processing unit coupled to the image input, and a controller coupled to the image processing unit and to the display. The image processing unit digitizes the analog image signal and reduces a sampling frequency offset in a first sampling frequency of the analog image signal and a second sampling frequency of the image processing unit, wherein the image processing unit computes the sampling frequency offset by computing values of an autocorrelation function with samples of the analog image signal and a delayed version of samples of the analog image signal, wherein the computing is performed for a range of delays. The controller controls the operation of the display based on the image data.

An advantage of an embodiment is that the sampling frequency offset may be acquired in a short period of time. This may reduce an amount of time between attempting to obtain the sampling frequency offset and displaying an image, which may help to improve a viewing experience for viewers.

Another advantage of an embodiment is that a large number of data points for use in determining the sampling frequency offset may be acquired in a short period of time. This may allow a computing of the sampling frequency offset to be more accurate due to the larger number of data points.

Another advantage of an embodiment is that a multiple stage operation may be utilized to help improve the accuracy of the determining of the sampling frequency offset. This may help to reduce the likelihood that images may be improperly displayed.

Yet another advantage of an embodiment is that it may enable a simple implementation in an application specific integrated circuit due to relatively simple operations used in the embodiment, namely, additions and subtractions.

Yet another advantage of an embodiment is that it may provide a more appropriate signal preconditioning mechanism that is suitable for the video processing environment.

A further advantage of an embodiment is that multi-pass techniques (multiple iterations) may be employed to achieve a more accurate determination of the sampling frequency offset while still requiring a relatively short amount of time.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a digital micromirror device (DMD) microdisplay-based image projection display system connected to an analog image source, such as a computer. The invention may also be applied, however, to other forms of analog image sources, such as analog video tape, analog DVDs, analog game console output, analog electronic video sources, such as multimedia players and sources, and so on. Furthermore, other forms of microdisplay-based image projection display systems, such as deformable micromirrors, liquid crystal on silicon (LCOS), ferroelectric liquid-crystal-on-silicon, reflective, transmissive, and transflective liquid crystal displays (LCD), and so forth. Additionally, the invention may be applied to other types of video display systems, including direct view display systems, such as those using plasma, LCD, cathode ray tube (CRT), and so on, displays. In general, the invention may be applied to applications wherein there is a desire to display an analog image source.

Figure 1A:
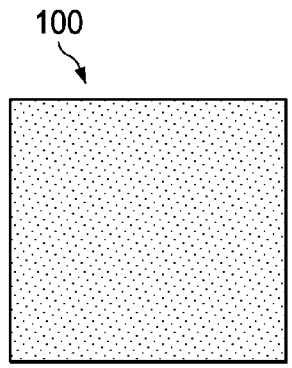
FIG. 1a is a diagram of an image frame from an analog image signal.
Figure 1B:
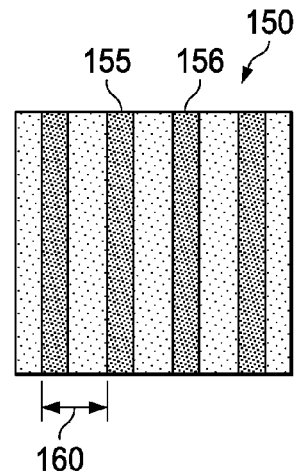
FIG. 1b is a diagram of a displayed image frame, wherein the image was digitized by an analog-to-digital converter with a non-zero sampling frequency offset.
Figure 2A:
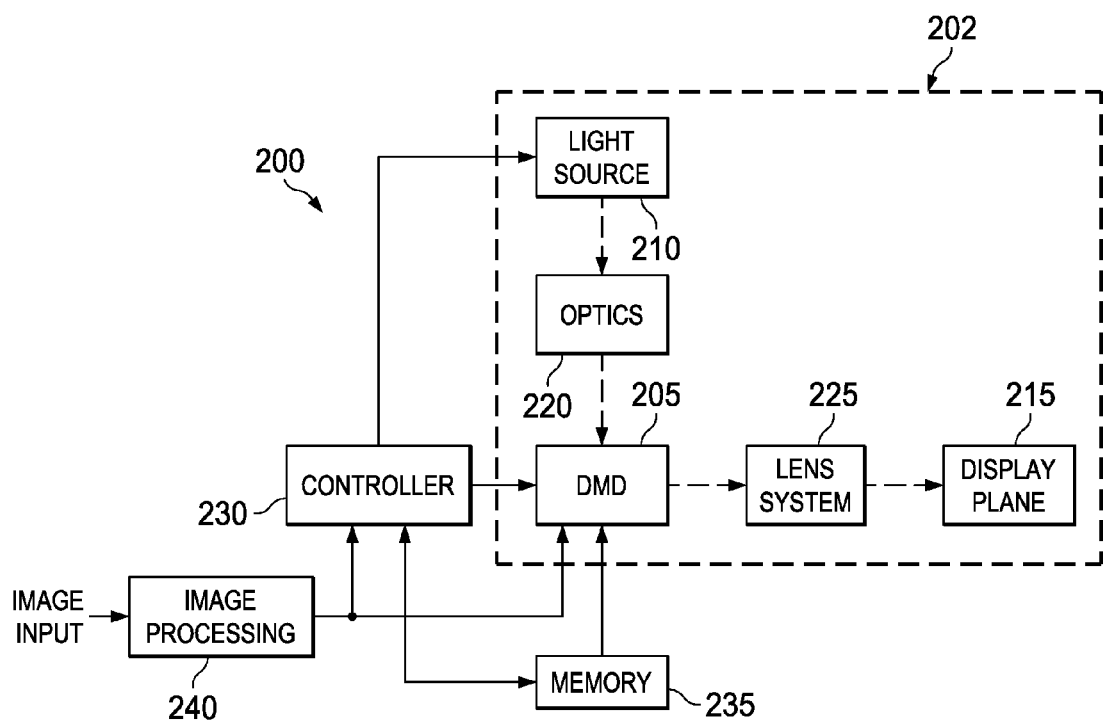
FIG. 2a is a diagram of a display system.

FIG. 2a illustrates an image display system 200. The image display system 200 includes an imaging unit 202 that may be used to display images. The image display system 200 shown in FIG. 2a is a DMD-based projection display system and the imaging unit 202 includes a DMD 205 that modulates light produced by a light source 210. The DMD 205 is an example of a microdisplay or an array of light modulators. Other examples of microdisplays may include transmissive or reflective liquid crystal, liquid crystal on silicon, ferroelectric liquid-crystal-on-silicon, deformable micromirrors, and so forth. In a microdisplay, a number of light modulators may be arranged in a rectangular, square, diamond shaped, and so forth, array.

Each light modulator in the microdisplay may operate in conjunction with the other light modulators in the microdisplay to modulate the light produced by the light source 210.

For example, in the DMD 205, each light modulator is a pivoting mirror that generally pivots between one of two positions depending on image data being displayed. In a first position, the light modulator reflects light from the light source onto a display plane 215 and in a second position, the light modulator reflects light away from the display plane 215. The light modulated by the DMD 205 may be used to create images on the display plane 215. The video projection display system 200 also includes an optics system 220, which may be used to collimate the light produced by the light source 210 as well as to collect stray light, and a lens system 225, which may be used to manipulate (for example, focus) the light reflecting off the DMD 205.

If the image display system 200 is a different form of image display system, then the imaging unit 202 may be correspondingly different. For example, if the image display system 200 uses a different form of microdisplay, then the imaging unit 202 may include the different microdisplay in place of the DMD 205. Alternatively, if the image display system 200 is a direct view system instead of a projection system, then the imaging unit 202 may not include the display plane 215 and potentially the lens system 225. Furthermore, if the image display system 200 is a cathode ray tube-based direct view system, then the imaging unit 202 may not include the light source 210, the optics system 220, the lens system 225, or the display plane 215. If the image display system 200 is a cathode ray tube-based projection system, then the imaging unit 202 may include the lens system 225 and the display plane 215.

The DMD 205 may be coupled to a controller 230, which may be responsible for loading image data into the DMD 205, controlling the operation of the DMD 205, providing micromirror control commands to the DMD 205, controlling the light produced by the light source 210, and so forth. A memory 235, which may be coupled to the DMD 205 and the controller 230, may be used to store the image data, as well as configuration data, color correction data, and so forth.

The image display system 200 includes an image processing unit 240. The image processing unit 240 may be used to digitize images from an analog image signal provided by an image input. The image processing unit 240 also includes a clock configured to provide a reference signal at a sampling frequency to time the digitizing of the images from the analog image signal. Additionally, the image processing unit 240 includes the ability to determine and correct for an offset that may be present between an actual sampling frequency of the analog image signal and a sampling frequency as generated by the clock. The image processing unit 240 uses techniques to determine a period of a vertical interference pattern present in images sampled at a sampling frequency having an offset from the actual sampling frequency of the analog image signal and to use the period of the vertical interference pattern to determine and then reduce or eliminate the offset.

Figure 2B:
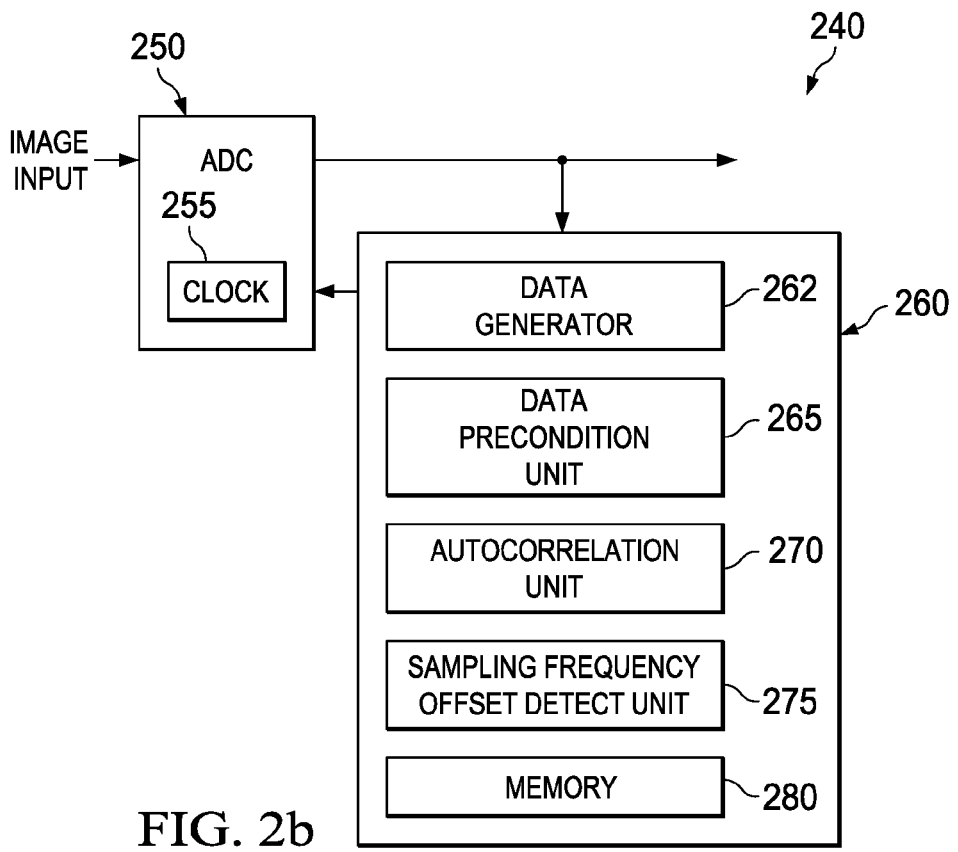
FIG. 2b is a diagram of an image processing unit.

FIG. 2b illustrates a detailed view of the image processing unit 240. The image processing unit 240 includes an analog to digital converter (ADC) 250 that may be used to digitize the analog image signal provided by the image input. The ADC 250 may be timed by a reference signal provided by a clock 255. The clock 255 may be internal to the ADC 250 or it may be external to the ADC 250. The reference signal provided by the clock 255 may be at a sampling frequency of the analog image signal. The sampling frequency of the analog image signal may be detected by a sampling frequency detect unit. The sampling frequency detect unit may use a timing based sampling frequency detection technique, a data based sampling frequency detection technique, or a combination of both to detect the sampling frequency of the analog image signal.

Please refer to a co-assigned U.S. patent application entitled "System and Method for Detecting a Sampling Frequency of an Analog Video Signal," Ser. No. 12/101,685, filed Apr. 11, 2008, which patent application is hereby incorporated herein by reference, for a detailed discussion of the detection of the sampling frequency of the analog image signal.

The image processing unit 240 also includes an offset determining and adjusting unit (ODA) 260. The ODA 260 may be used to determine if there is an offset present between an actual sampling frequency of the analog image signal and a sampling frequency as generated by the clock 255 to be used to sample the analog image signal. If there is an offset present, the ODA 260 may be capable of generating an adjustment to the clock 255 to eliminate (or reduce) the offset.

The ODA 260 includes a data generator 262. The data generator 262 may be used to create a column-wise summation of data (image data). The data generator 262 generates a one-dimensional data series from two-dimensional image data. The ODA 260 also includes a data precondition unit 265. The data precondition unit 265 may be used to perform clipping to help eliminate a negative impact on the offset detection by the presence of high amplitude glitches. Alternatively, the data precondition unit 265 may use a histogram of the image data to eliminate outliers in the high end bins, which may correspond to the high amplitude glitch or spikes. Alternatively, the data precondition unit 265 may use a cascade of a moving average followed by a median filter with a predefined window to eliminate interference from high frequency variations. Preferably, a typical window for the moving average and the median filter is three (3).

Figure 3A:
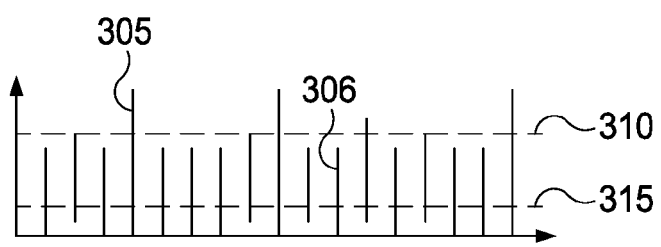
FIG. 3a is a diagram of a sample sequence.
Figure 3B:
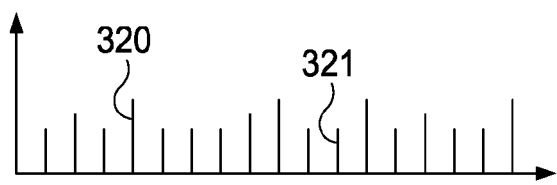
FIG. 3b is a diagram of a clipped sample sequence.

FIG. 3a illustrates a sequence of data samples that may be typical of a column-wise summation of data series generated by the data generator 262 when an ADC, such as the ADC 250, is sampling an image with an incorrect sampling frequency. Column-wise summation values, such as column-wise summation value 305 and column-wise summation value 306, may range in value depending on the values of a column of an image when the ADC 250 samples the image. Clipping eliminates values of the column-wise summation values that are above an upper threshold (shown as an upper threshold 310) and below a lower threshold (shown as a lower threshold 315). FIG. 3b illustrates a sequence of data samples corresponding to the sequence of column-wise summation values shown in FIG. 3a after having been clipped. A clipped column-wise summation value 320 may correspond to the column-wise summation value 305 after portions of the column-wise summation value 305 above the upper threshold 310 and below the lower threshold 315 have been eliminated. Similarly, a column-wise summation value 321 may correspond to a clipped column-wise summation value 306.

Turning back now to FIG. 2b, the ODA 260 also includes an autocorrelation unit 270. The autocorrelation unit 270 may be used to compute a period of the data samples (potentially after being preconditioned by the data precondition unit 265) by computing a difference between the data samples and a delayed version of the data samples. The computation performed by the autocorrelation unit 270, which may be referred to as an autocorrelation function, may be expressed mathematically as:

$$AC(\tau) = \sum_{i=0}^{sample\_length} (|\text{difference\_function}(i, i+\tau)|),$$

where AC(τ) is the autocorrelation function's value at delay τ, the function |expression| returns an absolute value of the expression, difference_function(i, i+τ) is a difference function, and sample_length is a number of data samples. Preferably, a unit delay is about equal to a sampling period, wherein the sampling period is the inverse of the sampling frequency. For example, if the sampling frequency is 1 KHz, then the sampling period is equal to 1 millisecond. Therefore, if τ is equal to three (3), then the data samples are delayed by three (3) milliseconds.

Preferably, the autocorrelation unit 270 implements a version of an average magnitude difference function (AMDF). The AMDF may be a simplified approximation of the correlation performed by the autocorrelation function, wherein computed values of the AMDF may be an opposite of typical autocorrelation function values. For example, a large AMDF value may be an indication of data that is less correlated, which may correspond to a low autocorrelation function value. The AMDF may be expressed mathematically as:

$$AMDF(\tau) = \sum_{i=0}^{sample\_length} (|sample(i+\tau) - sample(i)|),$$

where AMDF(τ) is the AMDF function's value at delay τ, the function expression returns an absolute value of the expression, sample(i) is an i-th data sample, sample(i+τ)−sample(i) is a difference function computing a difference between an i-th sample and an i+τ-th sample, and sample_length is a number of data samples. Average magnitude difference functions are widely used in the field of audio/speech processing to detect pitch and are considered to be well known by those of ordinary skill in the art and will not be discussed further herein.

The computed AMDF function AMDF(τ) values may be stored in a memory 280. The memory 280 may be located in the ODA 260 and may be a dedicated memory that may be used to store the computed AMDF function AMDF(τ) values. Alternatively, the memory 280 may be a part of the memory 235. The computed AMDF function AMDF(τ) values may be scaled to help prevent overflow.

Figure 4:
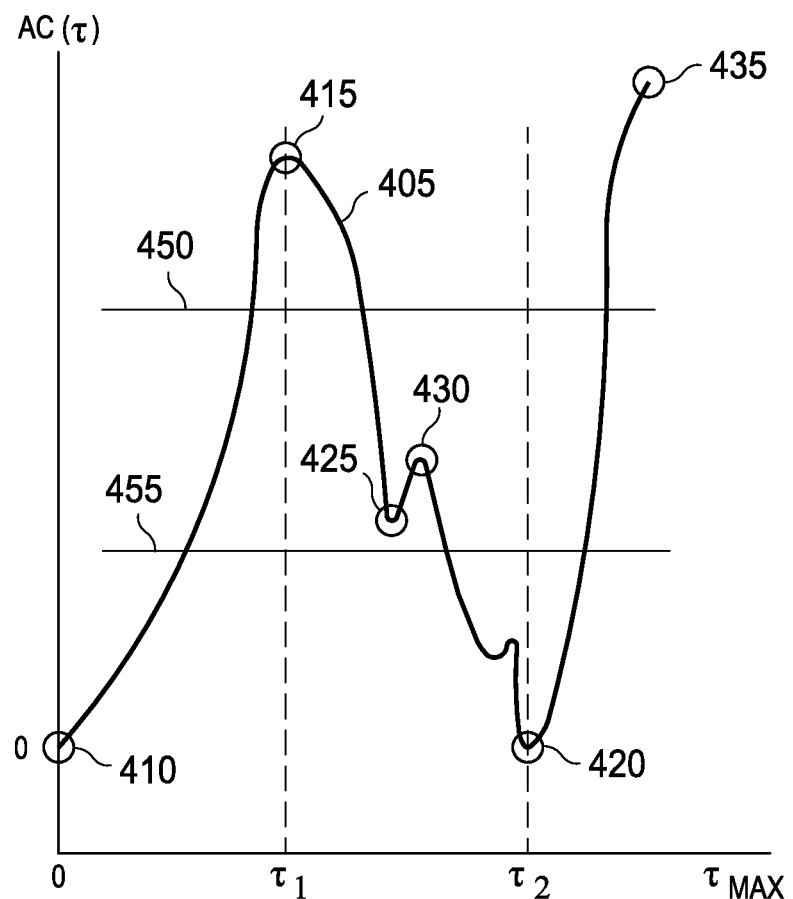
FIG. 4 is a data plot of values of an autocorrelation function for a range of delays.

Computing the AMDF function for a variety of delays τ ranging from zero (0) to a maximum delay $\tau_{max}$, may produce a data set having a number of minimums and maximums. Typically, the maximum delay $\tau_{max}$ may be set to be equal to the sample_length. FIG. 4 illustrates a data plot of the data set of the autocorrelation function AMDF(τ) values for τ ranging from zero (0) to $\tau_{max}$ for an exemplary analog image signal, wherein the data set is shown as trace 405. The data plot of the data set of the AMDF function AMDF(τ) values begins with a value of zero (highlight 410) at a delay of zero (0), which corresponds to a difference between the data sample sequence of the analog input signal and a delayed version of the data sample sequence with the delay equal to zero. The data plot of the data set of the AMDF function AMDF(τ) values may then increase or decrease in value depending on the period of the data sample sequence.

High values of the AMDF function AMDF(τ) values may indicate a large degree of difference between the data sample sequence and a delayed version of the data sample sequence and low values (approaching zero (0)) may indicate a large degree of similarity between the data sample sequence and a delayed version of the data sample sequence. For example, highlight 415 may indicate that at delay $\tau_1$, there is a large degree of difference between the data sample sequence and a delayed version of the data sample sequence, while at delay $\tau_2$ (highlight 420) there is a large degree of similarity between the two. There may also be local minima (for example, local minimum 425) and local maxima (for example, local maximum 430). There may also be at least one global minimum and at least one global maximum. There may typically be a global minimum located at a delay of zero. The location of the global maxima(s) and other global minima(s) may depend on the nature of the data sample sequence. As shown in FIG. 4, there is a global maximum at delay $\tau_{max}$.

When the value of the AMDF function AMDF(τ) for delays greater than zero becomes zero or approaches zero, i.e., when the AMDF function AMDF(τ) values reach or approach the global minimum, there may a large degree of similarity between the data sample sequence and a delayed version of the data sample sequence. Since the data sample sequence may possess a certain degree of periodicity due to the vertical interference pattern induced by the offset between the actual sampling frequency of the analog image signal and the sampling frequency provided by the clock 255, a difference between the delay zero (0) to the delay corresponding to where the AMDF function AMDF(τ) value approaches or reaches zero (0) may be related to the period of the vertical interference pattern, and therefore, the offset that may be present between the sampling frequency of the analog image signal and a sampling frequency provided by a clock, such as the clock 255. If the AMDF function AMDF(τ) values do not approach or become zero (0) for delays greater than zero, then the data sample sequence may not be periodic. This may mean that there is no offset present between the sampling frequency of the analog image signal and a sampling frequency provided by the clock 255.

FIG. 4 also illustrates an upper threshold 450 and a lower threshold 455 that may be helpful in preventing the selection of local minima, such as the local minimum 425, as a minimum corresponding to a delay that corresponds to the period of the vertical interference pattern. The upper threshold 450 and the lower threshold 455 may be defined as a function of the global maxima and the global minima. The upper threshold 450 may be expressed mathematically as:

Upper_Threshold=global_maxima−(global_maxima−global_minima)*threshold_ratio, and the lower threshold 455 may be expressed mathematically as:

Lower_Threshold=global_minima+(global_maxima−global_minima)*threshold_ratio.

Both the upper threshold 450 and the lower threshold 455 may be scaled by a predetermined value threshold_ratio. The value threshold_ratio may be used to adjust the upper and lower threshold values and may typically be in the range of 0.25 to 0.35.

The upper threshold 450 and the lower threshold 455 may be determined by computing the AMDF function AMDF(τ) for a variety of τ ranging from zero (0) to $\tau_{max}$ using images from the analog image signal. With the upper threshold 450 and the lower threshold 455 determined using the above formulas, maximums and minimums, such as maximum 415 and minimum 420, may be selected from a subsequent computing of the AMDF function AMDF(τ) for a variety of τ ranging from zero (0) to $\tau_{max}$, where the computing of the AMDF function AMDF(τ) may make use of different images from the analog image signal. For example, the determining of the upper threshold 450 and the lower threshold 455 may utilize a group of N images from the analog image signal and the determining of maximums and minimums may utilize a group of M images from the analog image signal, where N may or may not be equal to M.

Using the upper threshold 450 and the lower threshold 455, it may be possible to select maximums (also referred to as distinctive peaks), such as the maximum 415, and minimums (also referred to as distinctive nulls), such as the minimum 420. The distinctive peaks may be determined by using the following criteria:

distinctive peak=(a maximum located between $\tau$=0 and a distinctive null) or (a maximum between two distinctive nulls) and (larger than the upper threshold).

The distinctive nulls may be determined by using the following criteria:

distinctive null=(a minimum between two distinctive peaks) and (smaller than the lower threshold).

For example, the maximum 415 may be a maximum between $\tau$=0 and a distinctive null (the minimum 420), and the minimum 420 may be a minimum between two distinctive peaks (the maximum 415 and the maximum 435). The local minima 425 and the local maxima 430 may not be selected since they fail the relationship requirement with respect to the upper threshold 450 and the lower threshold 455.

Turning back now to FIG. 2b, the ODA 260 also includes a sampling frequency offset detect (SFOD) unit 275. The SFOD unit 275 may be used to process computed values of the AMDF function AMDF($\tau$) for a range of delays to determine an offset, if any, between the sampling frequency of the analog image signal and a sampling frequency provided by the clock 255. The computed values of the AMDF function AMDF($\tau$), computed by the autocorrelation unit 270 and potentially stored in the memory 280, may be processed by the SFOD unit 275 to determine a location of a first distinctive minimum, such as the minimum 420 of FIG. 4. The delay value $\tau$ of the first distinctive minimum may correspond to a period of the vertical interference pattern, and therefore, may be inversely related to the offset between the sampling frequency of the analog image signal and a sampling frequency provided by the clock 255.

Figure 5A:
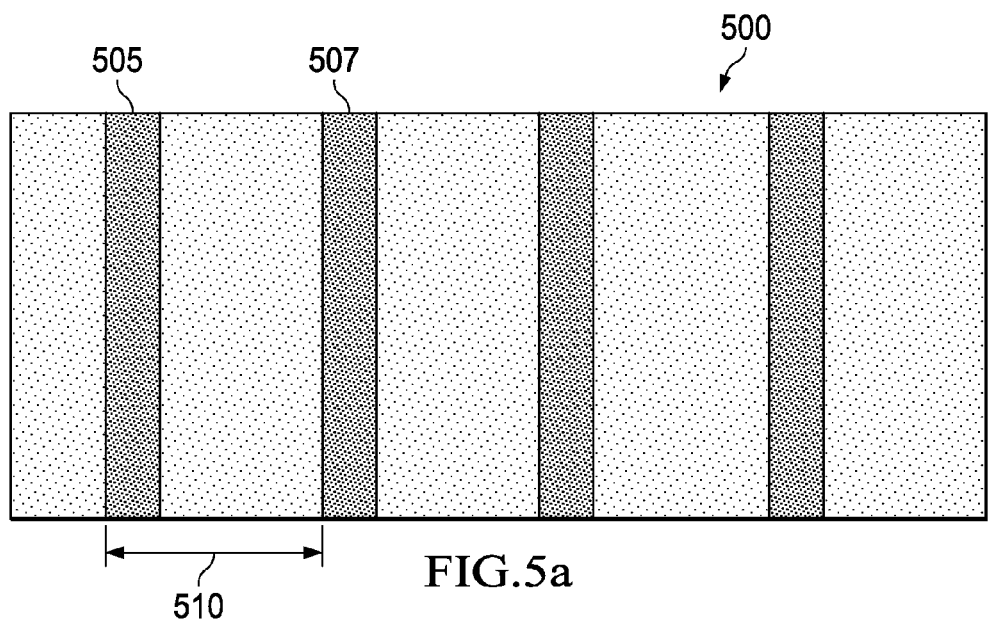
FIG. 5a is a diagram of a displayed image frame, wherein the image was digitized by an analog-to-digital converter with a non-zero sampling frequency offset.

FIG. 5a illustrates a diagram of a displayed image 500 wherein there is a non-zero offset between the sampling frequency of an analog image signal containing the displayed image and a sampling frequency used to sample the analog image signal. The offset may result in a vertical interference pattern that may be visible on the displayed image 500. The vertical interference pattern includes several vertical bars, such as vertical bar 505 and vertical bar 507. The vertical bars in the vertical interference pattern may be periodic in nature and there may be a relatively consistent separation from individual vertical bars in the vertical interference pattern. For example, a separation (shown as span 510) between the vertical bar 505 and the vertical bar 507 may be similar to separations between other adjacent vertical bars.

Figure 5B:
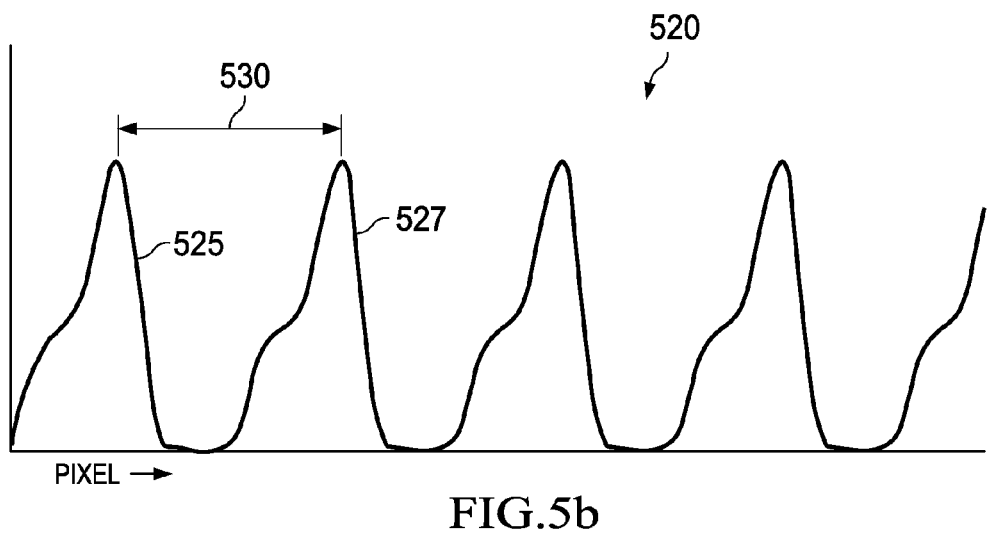
FIG. 5b is a data plot of a column-wise summed frame-to-frame difference of consecutive images.

FIG. 5b illustrates a data plot 520 of a column-wise summed frame-to-frame difference for successive images. The column-wise summed frame-to-frame difference may be defined as a measure of a difference between successive images taken in a columnar region of the image. The difference is a function that may be dependent on the location of the columnar region. Please refer to the co-assigned U.S. patent application entitled "Method and Apparatus for Analog Graphics Sample Clock Frequency Offset Detection and Verification," U.S. Patent Application Publication Number 2006/0274194, filed Feb. 16, 2006, for a detailed discussion of the column-wise summed frame-to-frame difference.

The column-wise summed frame-to-frame difference for successive images, which may include the displayed image 500, may feature several peaks, such as peak 525 and peak 527. The peaks in the column-wise summed frame-to-frame difference may correspond to portions of the successive images having a significant amount of similarity. The peaks in the column-wise summed frame-to-frame difference may correspond to the vertical bars in the vertical interference pattern in the displayed image 500. For example, the peak 525 may correspond to the vertical bar 505 and the peak 527 may correspond to the vertical bar 507.

Like the separation between the vertical bars in the vertical interference pattern, the peaks in the column-wise summed frame-to-frame difference may be periodic. For example, a separation of the peaks, such as a separation (shown as span 530) between the peak 525 and the peak 527 may be similar to separations between other peaks. Since the peaks may be more distinct, it may be easier to measure the separation between the peaks than the separation between the vertical bars.

Figure 5C:
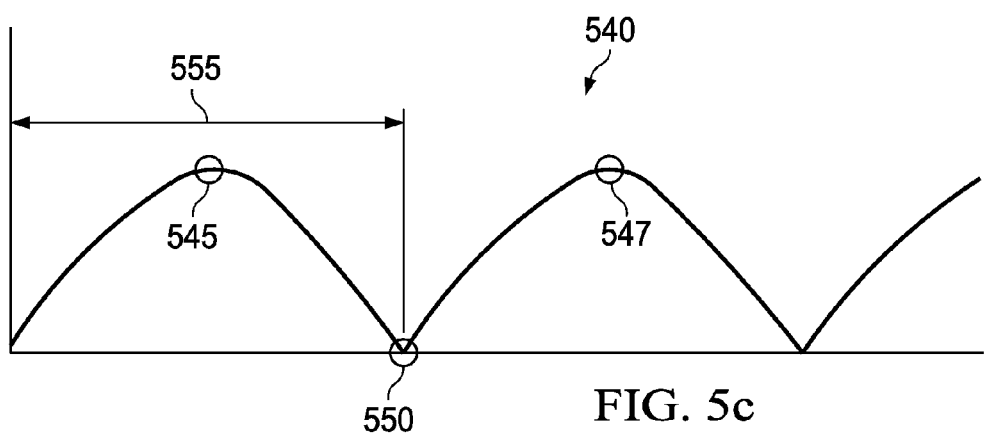
FIG. 5c is a data plot of values of an autocorrelation function.

FIG. 5c illustrates a data plot 540 of an AMDF function AMDF($\tau$) for $\tau$ ranging from zero (0) to $\tau_{max}$. The data plot 540 features several distinctive peaks, such as a first distinctive peak 545 and a second distinctive peak 547, as well as several distinctive nulls, such as a first distinctive null 550. As discussed previously, when the AMDF function AMDF($\tau$) at delay $\tau$ is about equal to zero (0), then there may be a significant amount of similarity between a data sample sequence (potentially clipped or otherwise preconditioned by the data precondition unit 265) and a delayed version of the data sample sequence delayed by $\tau$. This may mean that the data sample sequence is periodic with period about equal to $\tau$. Therefore, the delay value of the first distinctive null 550 or the delay difference between the delay value of the first distinctive null 550 and $\tau$=0 (shown in FIG. 5c as span 555) may correspond to the period of the data sample sequence, i.e., the period of the vertical interference pattern in the displayed image 500 or the period of the peaks in the column-wise summed frame-to-frame difference 520.

Turning back now to FIG. 2b, the offset (if any) detected by the ODA 260 may then be adjusted out of the sampling frequency provided to the ADC 250 by the clock 255. For example, the ODA 260 may provide to the clock 255 a signal that is proportional to the offset and the clock 255 may make adjustments to the reference signal provided to the ADC 250. Alternatively, the ODA 260 may provide a frequency control word (FCW) to the clock 255 that may specify to the clock 255 the sampling frequency that the clock 255 should provide to the ADC 250 to eliminate (or reduce) the offset.

The ODA 260 may operate in a continuous or substantially continuous manner to help ensure that the sampling of the analog image signal is occurring at (or about) the sampling frequency of the analog image signal. A one-time correction of the offset may not be sufficient to ensure good performance due to changes in the operation of the clock 255 and/or the ADC 250 due to changes in temperature, voltage supply level, the analog input signal, and so forth.

Figure 6:
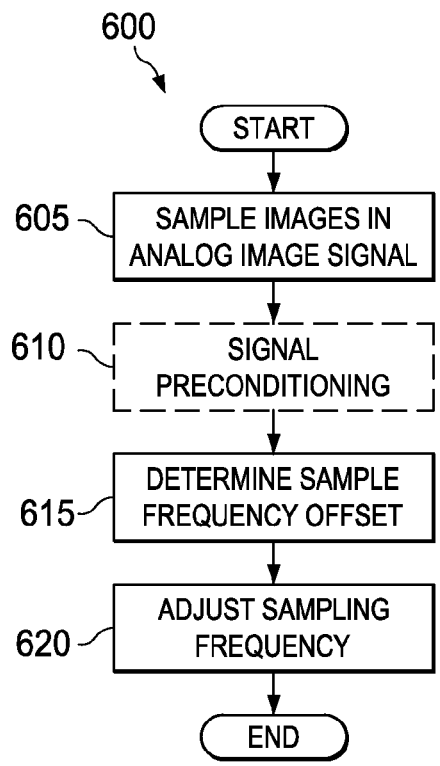
FIG. 6 is a diagram of a sequence of events in the determining of a sampling frequency offset.

FIG. 6 illustrates a high-level sequence of events 600 in the determining of an offset in a sampling frequency of an analog image signal and a sampling frequency used to time the sampling of the analog image signal. As discussed previously, the determining of the offset may occur continuously or substantially continuously during the operation of an electronic device, such as an image display device, a television, and so forth. Alternatively, the determining of the offset may occur periodically. For example, the determining of the offset may occur once every few minutes. In yet another alternative, the determining of the offset may occur after a detection of a specified event. For example, the determining of the offset may occur if the temperature of the electronic device changes, the voltage provided by a power supply of the electronic device changes, and so forth.

The determining of the offset may begin with a sampling of images in an analog image signal (block 605). The sampling of the images may occur at a sampling frequency as provided by a clock, such as the clock 255 internal (or external) to the ADC 250. The sampling frequency may be determined from images in the analog image stream. Please refer to co-assigned U.S. patent application entitled "System and Method for Detecting a Sampling Frequency of an Analog Video Signal," Ser. No. 12/101,685, filed Apr. 11, 2008, and "System and Method for Tuning a Sampling Frequency," Ser. No. 12/172,360 filed Jul. 14, 2008, which patent applications are hereby incorporated herein by reference, for a detailed discussion of a technique for determining a sampling frequency from the analog signal stream.

As the images of the analog image signal are being sampled at the sampling frequency, the samples of the images may be optionally preconditioned by the data precondition unit 265 (block 610). Preconditioning, which may include phase shifting cancellation, clipping, histogram thresholding, computing of a moving average, median filtering, and so forth may help to eliminate or reduce jitter and glitches, which may negatively impact the determining of the offset.

Figure 7:
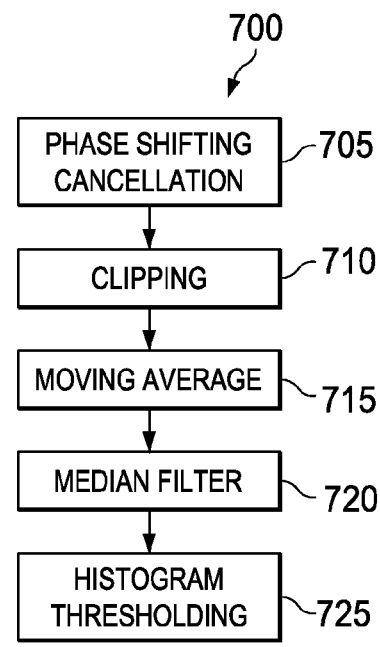
FIG. 7 is a diagram of a sequence of events in the preconditioning of data samples.

FIG. 7 illustrates a sequence of events 700 for preconditioning of the samples of the images. The preconditioning of the samples of the images may include phase shifting cancellation (block 705), clipping, such as center clipping (block 710), a moving average computation (block 715), a median filter may be applied (block 720), histogram thresholding (block 725), and combinations thereof. Histogram thresholding may involve the generating of a histogram for an image and then discarding samples of the image in higher and lower level bins. A choice may be made related to a column width used in the computing of the moving average and/or the median filter. The choice of column width may provide a measure of low pass filtering, with a smaller sampling frequency offset allowing/requiring a larger column width and similarly, a larger sampling frequency offset allowing/requiring a smaller column width. The choice of a column width greater than one (1) may be referred to as windowing. Although shown as occurring in a particular order, an actual ordering of the preconditioning of the samples of the image may differ depending on implementation, resource scheduling, and so forth.

Figure 8A:
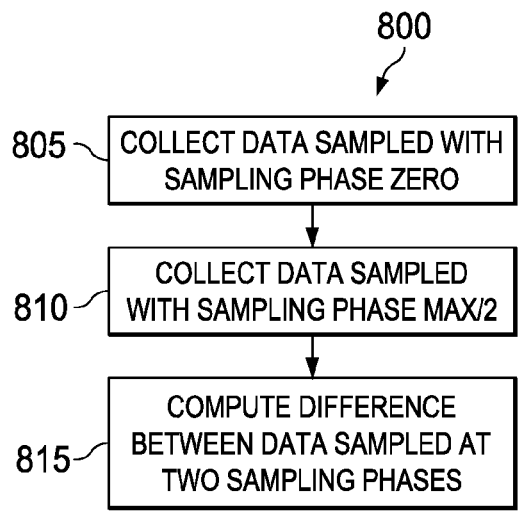
FIG. 8a is a diagram of a sequence of events in phase shifting cancellation preconditioning of data samples.

FIG. 8a illustrates a sequence of events 800 for additional preconditioning of samples of the images. The sequence of events 800 may be descriptive of phase shifting cancellation preconditioning of samples of the images. The phase shifting cancellation preconditioning of samples of the images may include sampling the images with a sampling phase set to zero, which may mean that the samples of the images are taken without any offset (block 805). Additionally, the samples of the images may be made with a sampling phase set to about one-half of a total offset range (block 810). For example, if there are 32 sampling phases, then the sampling phase may be set at 15, while if there are 64 sampling phases, then the sampling phase may be set at 31. In general, the two sampling phases may be about equal to (a number of sampling phases)/2 apart. This may result in two sample sequences that are sampled with offsets that are as far apart as permitted. Then, a difference between the samples may be computed (block 815). The computing of the difference may serve to help reduce noise that may arise from the sampling of the images.

Figure 8B:
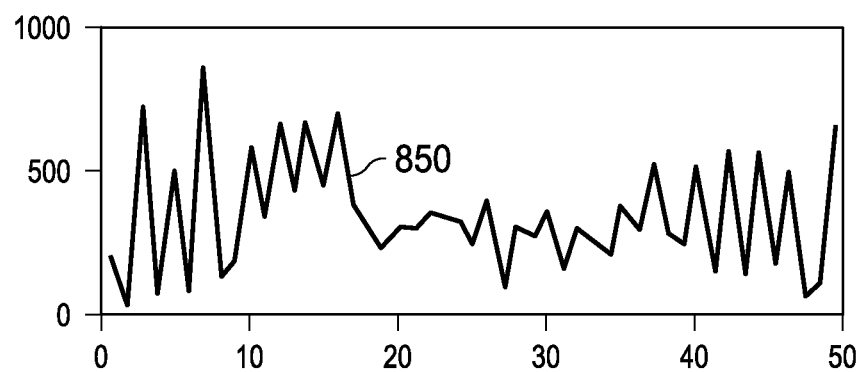
FIG. 8b through 8d are data plots illustrating the effect of phase shift cancellation preconditioning of data samples.
Figure 8C:
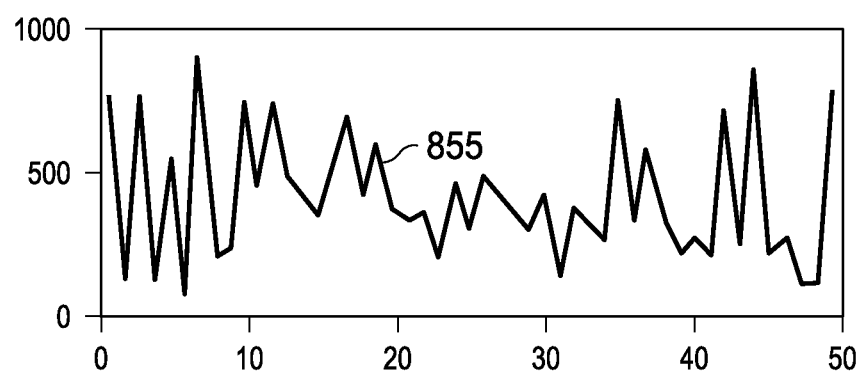
Figure 8D:
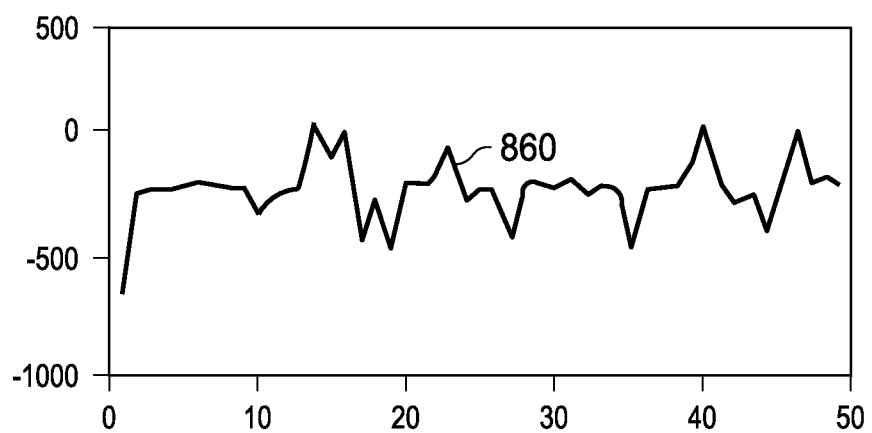

FIG. 8b illustrates a data plot of a frame to frame difference corresponding to a first sample sequence generated by sampling an image with a sampling phase zero (0) (shown as a trace 850), FIG. 8c illustrates a data plot of a frame to frame difference corresponding to a second sample sequence generated by sampling an image with a sampling phase 15 (shown as a trace 855), and FIG. 8d illustrates a data plot of a difference between the first sample sequence and the second sample sequence (shown as a trace 860). Generally, the trace 860 displays a lower amount of noise, which may help improve the performance of the determining of the offset, for example. Noise that may remain may be further attenuated with other preconditioning operations, such as clipping, histogram thresholding, median filtering, computing a moving average, and so forth.

Figure 9:
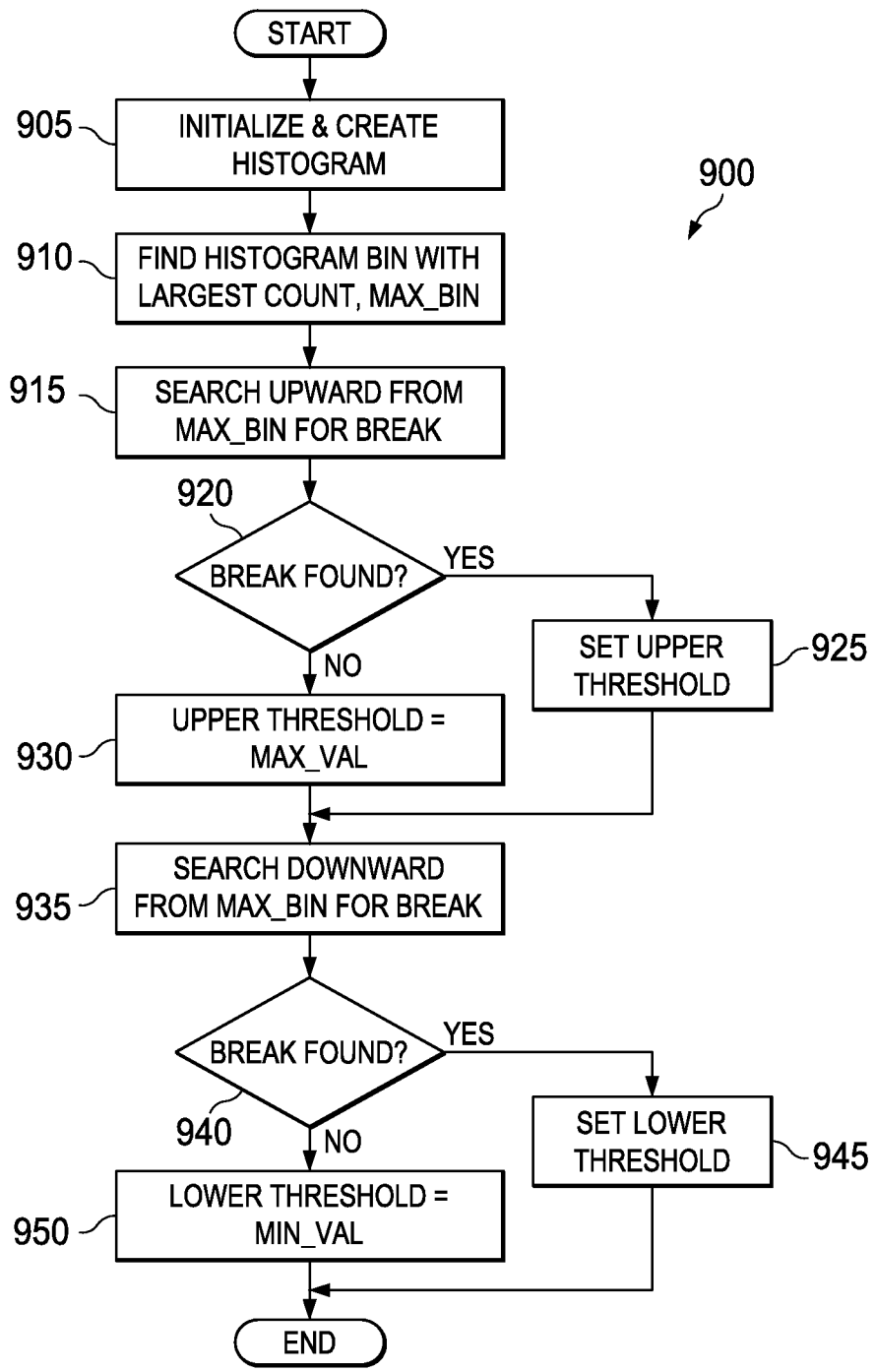
FIG. 9 is a diagram of a sequence of events in histogram thresholding preconditioning of data samples.

FIG. 9 is a diagram of a sequence of events 900 in the histogram thresholding preconditioning of data samples. Histogram thresholding may involve the generating of a histogram for an image and then discarding samples of the image in higher and lower level bins. This may help to eliminate or reduce jitter and glitches. The histogram thresholding preconditioning may begin with an initialization of a histogram and variables and creation of the histogram (block 905). For example, variables such as a number of bins in the histogram (BIN_NUM), a largest bin count value (MAX_BIN), an upper threshold, a lower threshold, and so forth, may be generated. The histogram may be created from samples of the image. The histogram may be created from adjacent pixel differences or frame to frame differences.

After the histogram has been created, the histogram may be searched to find a histogram bin with a largest count value, MAX_BIN (block 910). The histogram bin with the largest count value (MAX_BIN) may be found by comparing the various histogram bin count values. Then, from the histogram bin with the largest count value, a search may be performed over histogram bins that have indices that are greater than the index of MAX_BIN (block 915). The search may be to find a break in the histogram data. For example, a break in the histogram data may be defined as a number of consecutive histogram bins with zero count values. A typical number of consecutive histogram bins may be 5 to 10 or 10 to 20 percent of a total number of histogram bins.

If a break in the histogram data is found (block 920), then the upper threshold may be set to a histogram bin corresponding to the break in the histogram data (block 925). For example, the upper threshold may be set to:

upper_threshold=max_val−bin_size(bin_num−current_bin), where max_val is a largest value of an input sample, bin_size is a range of adjacent pixel difference or frame to frame difference corresponding to a single histogram bin, bin_num is the index of the histogram bin number, and current_bin is an index of the current histogram bin. If no break in the histogram data was found and all of the histogram bins having index values greater than MAX_BIN have been searched, then the upper threshold may be set to max_val (block 930).

After the upward search, a search may be performed over histogram bins that have indices that are smaller than the index of MAX_BIN (block 935). If a break in the histogram data is found (block 940), then the lower threshold may be set to a histogram bin corresponding to the break in the histogram data (block 945). For example, the upper threshold may be set to:

lower_threshold=min_val+bin_size*current_bin, where min_val is a smallest value of an input sample, bin_size is a range of adjacent pixel difference or frame to frame difference corresponding to a single histogram bin, and current_bin is an index of the current histogram bin. If no break in the histogram data was found and all of the histogram bins having index values smaller than MAX_BIN have been searched, then the lower threshold may be set to min_val (block 950). The upper threshold and the lower threshold may then be used to eliminate samples of the image that are higher than the upper threshold or lower than the lower threshold.

Figure 10A:
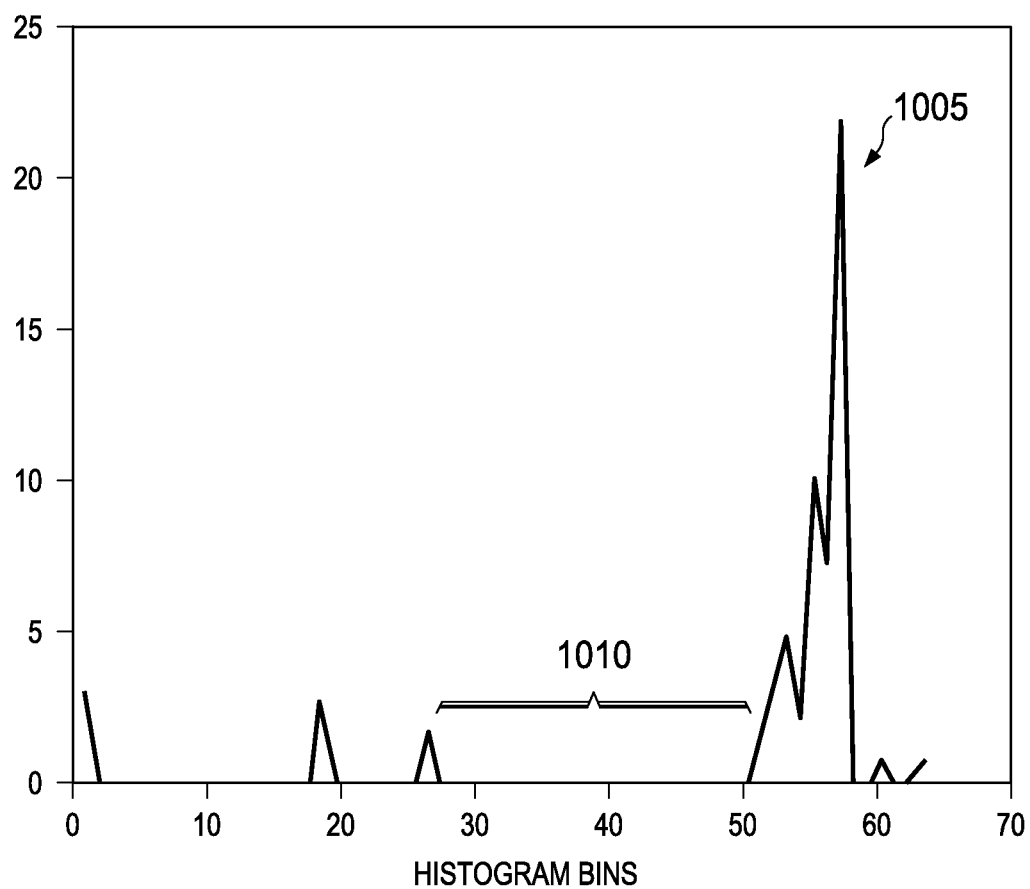
FIG. 10a is a data plot of a histogram.
Figure 10B:
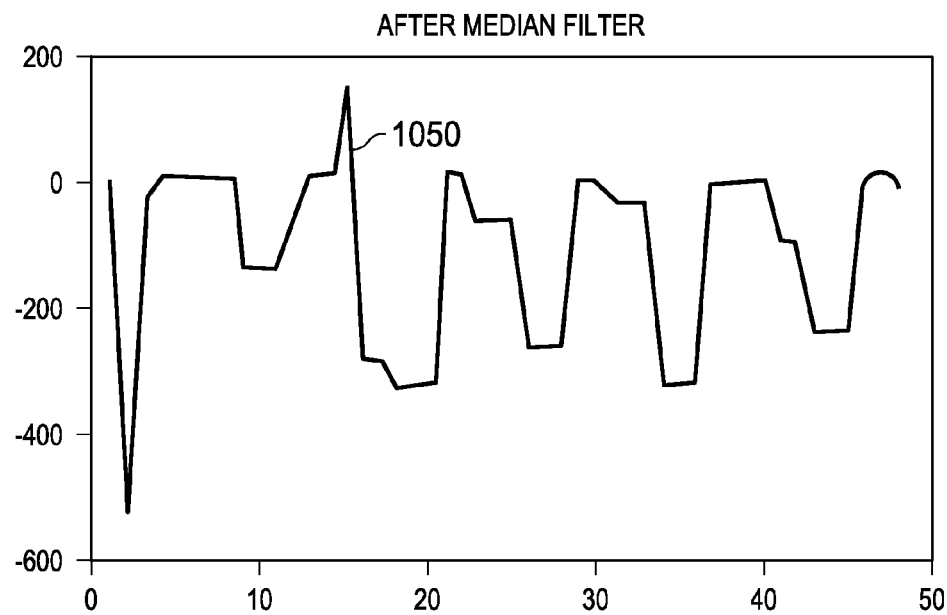
FIGS. 10b and 10c are data plots illustrating the effect of median filtering and histogram thresholding preconditioning of data samples.
Figure 10C:
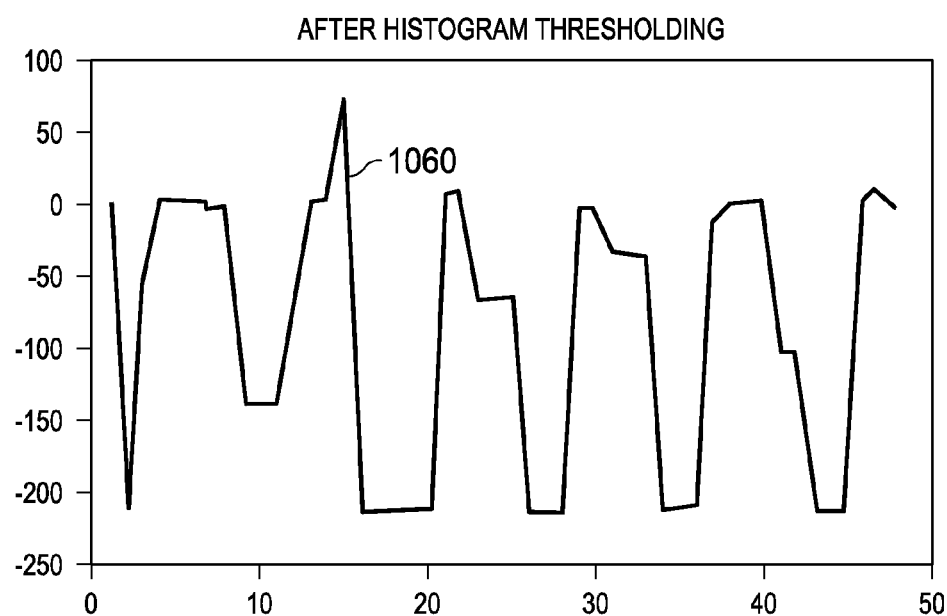

FIG. 10a illustrates a data plot of a histogram. Shown in FIG. 10a is a histogram bin having a maximum counter value (pointer 1005) and a break 1010 for indices smaller than an index corresponding to the histogram bin having the maximum counter value. As shown in FIG. 10a, there may not be a break for indices larger than the index corresponding to the histogram bin having the maximum counter value. FIG. 10b illustrates a data plot showing adjacent pixel difference of samples of the image after a median filter has been applied (shown as trace 1050). FIG. 10c illustrates a data plot showing adjacent pixel difference of samples of the image after histogram thresholding has been applied (shown as trace 1060). The trace 1060 displays a clean signal with very little noise.

Returning now to FIG. 6, after the optional preconditioning, the samples of the image may be used to determine the offset (block 615). The offset may then be used to adjust the sampling frequency (block 620).

As discussed previously, the offset may be determined from the samples of the image by computing an autocorrelation function $AC(\tau)$ for various delay ($\tau$) values, ranging from zero (0) to a maximum delay, $\tau_{max}$. The autocorrelation function may be expressed mathematically as:

$$AC(\tau) = \sum_{i=0}^{sample\_length} (|difference\_function(i, i+\tau)|),$$

where $AC(\tau)$ is the autocorrelation function's value at delay C, the function |expression| returns an absolute value of the expression, difference_function(i, i+$\tau$) is a difference function computing a difference between a sample(i) and a sample (i+$\tau$), and sample_length is a number of data samples. The computed autocorrelation function values may then be processed to determine the offset. The autocorrelation function may be implemented using an average magnitude difference function (AMDF), which may be a special form of autocorrelation function. A typical value of sample_length may be 512 samples, with larger values of sample_length potentially yielding more accurate results, while a typical value for $\tau_{max}$ may be one-half (½) times the sample_length. Other typical values of sample_length may be 48, 64, 128, 256, 1024, and so forth, samples, and other typical values for $\tau_{max}$ may be ¼, ⅜, and so forth, times the sample_length.

Figure 11A:
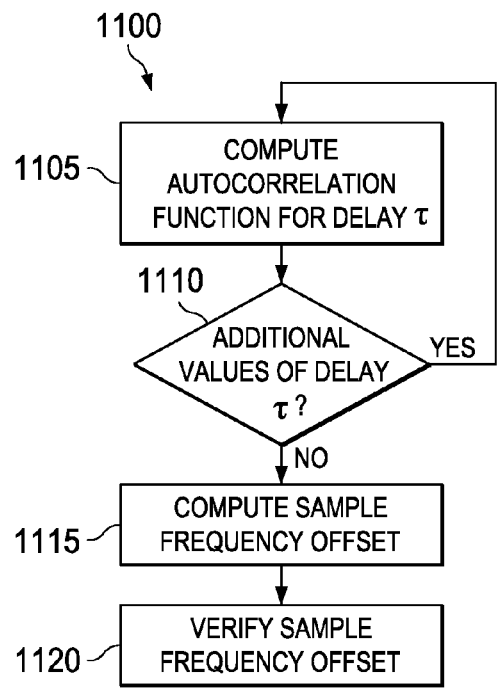
FIG. 11a is a diagram of a sequence of events in the determining of a sampling frequency offset.

FIG. 11a illustrates a sequence of events 1100 in computing the offset. The sequence of events 1100 may be an implementation of the use of samples of the images to determine the offset (block 615 of FIG. 6). The computing of the offset may begin by computing the AMDF function AMDF($\tau$) for a value of $\tau$ (block 1105). The computed AMDF function AMDF($\tau$) may then be saved. The computing of the AMDF function AMDF($\tau$) may be repeated for additional values of $\tau$ (block 1110). After computing the AMDF function AMDF($\tau$) for the different values of $\tau$ (block 1110), the computed AMDF function AMDF($\tau$) values may be used to compute the offset (block 1115).

The computing of the offset from the computed AMDF function AMDF($\tau$) may include a determining of a $\tau$ value that corresponds to a location of a first distinctive null, wherein a first distinctive null may be defined as a minimum between two distinctive peaks. The $\tau$ value of the first distinctive null may correspond to the offset expressed in sample time. The sampling frequency offset (offset) may be expressible as:

$$offset = (current\_sample\_period - correct\_sample\_period)$$

$$offset = \left(\frac{current\_sample\_period}{loc\_first\_distinctive\_null}\right),$$

where loc_first_distinctive_null is the location (value) of the first distinctive null, current_sample_period is the sampling period of the sampling frequency used to sample the analog image signal, and correct_sample_period is the sampling period of the analog image signal. If there are no distinctive nulls, then there may not be a sampling frequency offset. After computing the offset, the offset may be verified (block 1120). The verification of the offset may be optional. Furthermore, if windowing (column widths greater than one (1)) is used to perform filtering, then the sampling frequency offset may be expressed as:

$$offset = \left(\frac{current\_sample\_period}{column\_width * loc\_first\_distinctive\_null}\right),$$

where column_width is the width of the window.

As an example, let the correct sampling frequency of the analog image signal correspond to 998 samples per horizontal line and let the current sampling frequency used to sample the analog image signal correspond to 1000 samples per horizontal line and the column width equal to one (1). A figure displayed with such a sampling frequency offset may have two vertical bars separated by 500 samples and a plot of the computed AMDF function AMDF($\tau$) values may have a first distinctive null at 500. Then, the sampling frequency offset is equal to:

$$offset = (1000 - 998) = \left(\frac{1000}{500 * 1}\right).$$

Figure 12A:
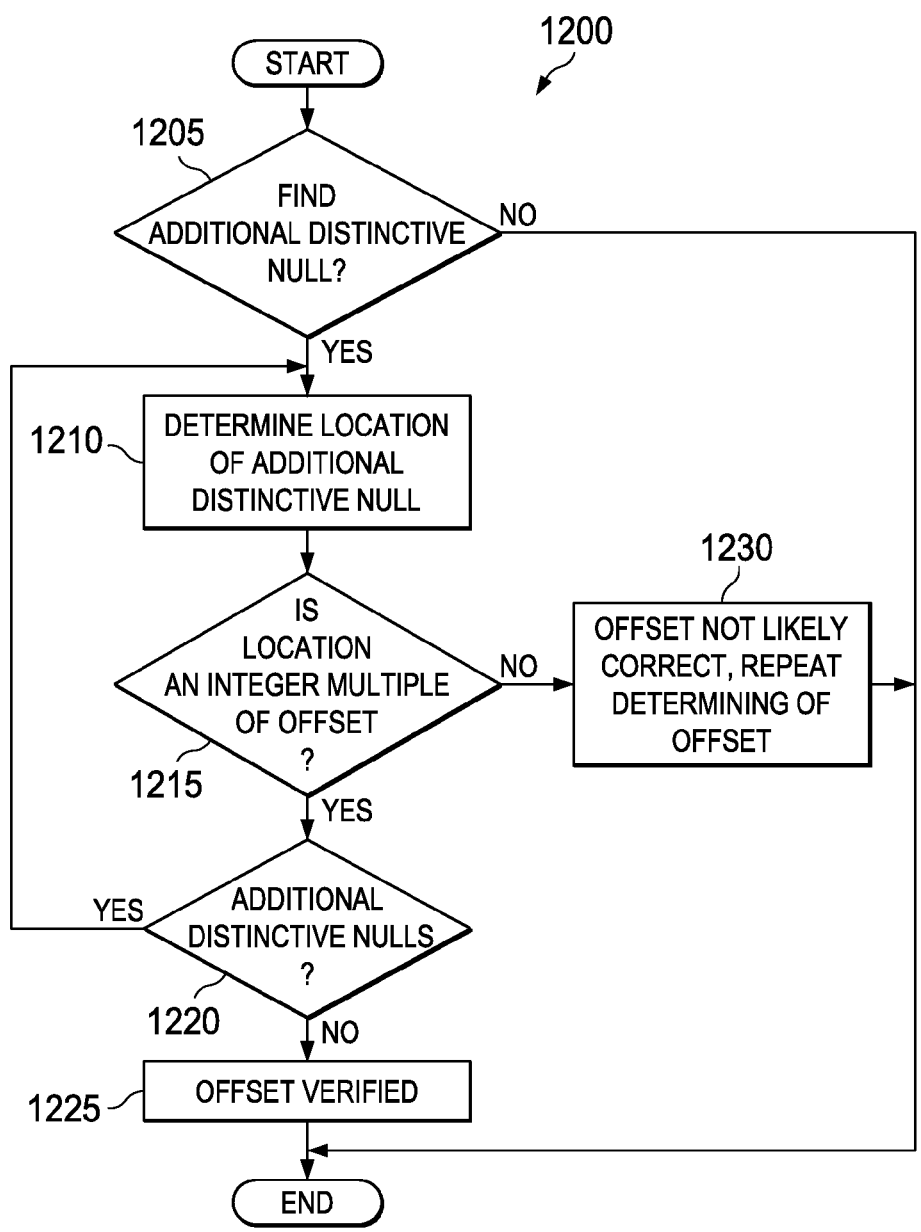
FIG. 12a is a diagram of a sequence of events in verifying a sampling frequency offset.

The verification of the offset may help to ensure that the offset is correct. FIG. 12a illustrates a sequence of events 1200 in the verification of the offset. The verification of the offset may begin with a continued processing of the computed AMDF function AMDF($\tau$) values to find additional distinctive nulls (block 1205). If no additional distinctive nulls are found, then another technique for verification of the offset may be needed and the sequence of events 1200 may terminate.

If an additional distinctive null is found (block 1205), then a delay associated with the distinctive null may be determined (block 1210). A check may be performed to determine if the delay associated with the distinctive null is an integer multiple of the offset (block 1215). For example, if the offset is 113, then exemplary values for the delay associated with the distinctive null may be 226 (2*113), 339 (3*113), 452 (4*113), and so forth. The delay associated with the distinctive null may not need to be exactly equal to 226, 339, 452, or so on, but the delay associated with the distinctive null should be about equal to an integer multiple of the offset.

If the delay associated with the distinctive null is equal or about equal to an integer multiple of the offset (block 1215), then the check may be repeated for any additional distinctive nulls found (block 1220). If all delays associated with distinctive nulls are equal or about equal to an integer multiple of the offset, then the offset may be deemed as verified (block 1225). However, if the delay associated with the distinctive null is not equal to an integer multiple of the offset (block 1215), then the offset may not be deemed as being verified and the determination of the offset may need to be repeated (block 1230).

Figures 12B, 13:
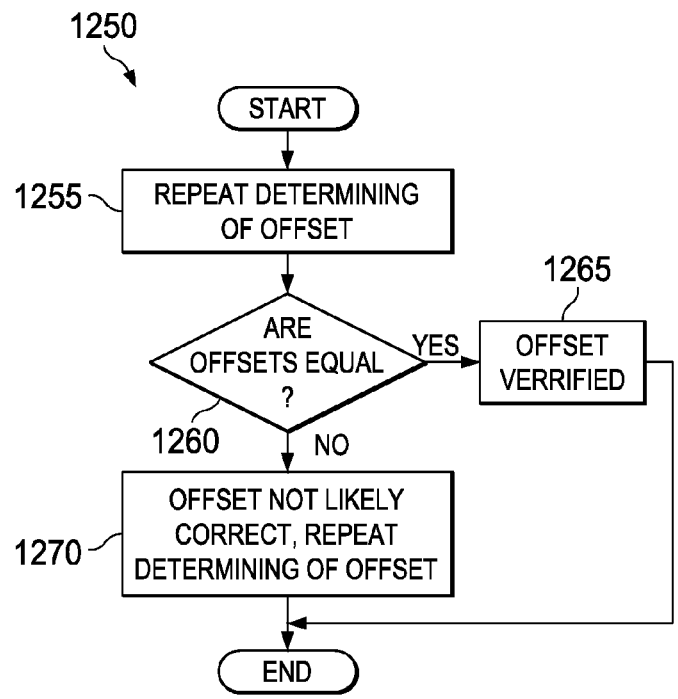
FIG. 12b is a diagram of a sequence of events in verifying a sampling frequency offset.
FIG. 13 is a diagram of a sequence of events in setting operational parameters of an analog-to-digital converter.

FIG. 12*b* illustrates a sequence of events 1250 in the verification of the offset. The verification of the offset may begin by repeating the determining of the offset (block 1255). For example, the sequence of events 600 for determining of the offset may be repeated. The repeating of the determining of the offset may result in the computing of a second offset. The second offset and the offset may be compared (block 1260) and if they are equal or about equal, then the offset may be deemed to be verified (block 1265) and the verification of the offset may terminate. However, if the second offset and the offset are not equal, then the offset may not be deemed as being verified and the determination of the offset may need to be repeated (block 1270).

Figure 11B:
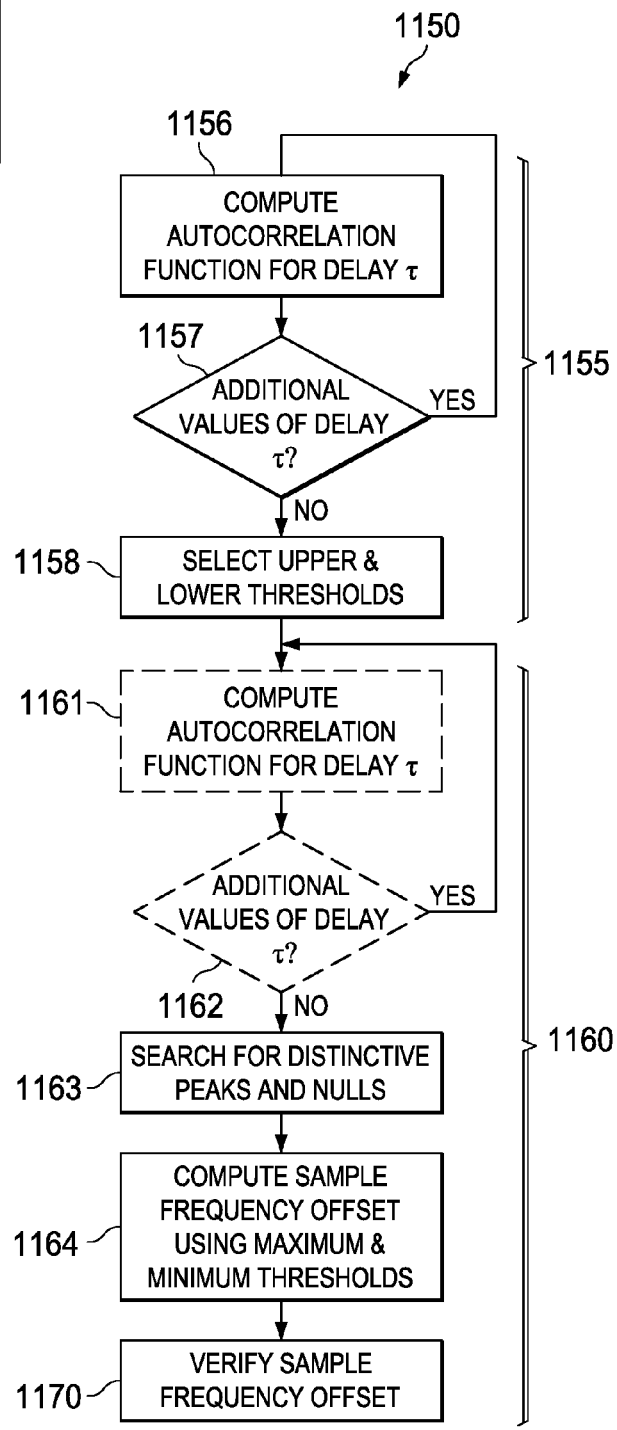
FIG. 11b is a diagram of a sequence of events in the determining of a sampling frequency offset, wherein a multi-stage process is used to determine the sampling frequency offset.

Turning now to FIG. 11*b*, which illustrates a sequence of events 1150 in computing the offset, wherein the computing the offset uses a multi-stage approach. Since the computing of the offset may not need to occur in real-time, additional time may be devoted to the computing of the offset in order to obtain a more accurate result. A multi-stage approach may achieve a more accurate result by helping to eliminate an erroneous detection of distinctive nulls and distinctive peaks in the computed AMDF function AMDF($\tau$) values. The sequence of events 1150 may be an implementation of the use of samples of the images to determine the offset (block 615 of FIG. 6).

Figure 11C:
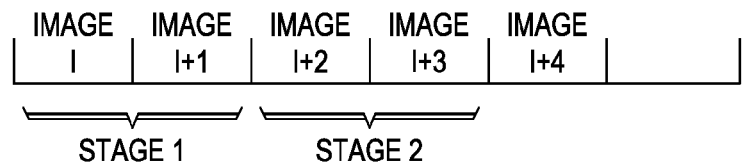
FIG. 11c is a diagram of multi-stage processing of images in an analog image signal to determine the sampling frequency offset.

The sequence of events 1150 may include two stages. A first stage 1155 may include a first computing of the AMDF function AMDF($\tau$) values to allow for an initial processing of the AMDF function AMDF($\tau$) values to determine a range of possible AMDF function AMDF($\tau$) values and a second stage 1160 may include an optional second computing of the autocorrelation function AC($\tau$) values to actually compute the offset. The first computing of the autocorrelation function AC($\tau$) values and the second computing of the AMDF function AMDF($\tau$) values may use different images from the analog image signal. For example, the first computing of the AMDF function AMDF($\tau$) values may use samples of images I and I+1 from the analog image signal, while the second computing of the AMDF function AMDF($\tau$) values may optionally use samples of image I+2 and image I+3 from the analog image signal (shown in FIG. 11*c*). Alternatively, the computing of the AMDF function AMDF($\tau$) values may not use all samples from a single image and the first computing of the AMDF function AMDF($\tau$) values may use a first portion of a single image and the second computing of the AMDF function AMDF($\tau$) may use a second portion of the single image. In addition to potentially using additional images (image I+2 and image I+3), the multistage operation of the sequence of events 1150 may make use of the time represented by the additional images to complete the computing and/or verifying of the sample frequency offset.

The first stage 1155 includes computing the AMDF function AMDF($\tau$) value for a value of $\tau$ (block 1156) and repeating the computing of the AMDF function AMDF($\tau$) values for remaining values of $\tau$ (block 1157). After computing the AMDF function AMDF($\tau$) value for a variety of $\tau$, the computed AMDF function AMDF($\tau$) values may be processed to select an upper threshold and a lower threshold (block 1158). The upper threshold and the lower threshold may be selected from the computed AMDF function AMDF($\tau$) values using the following formulas:

$$\text{upper threshold} = \text{global\_maxima} - (\text{global\_maxima} - \text{global\_minima}) * \text{threshold\_ratio},$$

and $$\text{lower threshold} = \text{global\_minima} + (\text{global\_maxima} - \text{global\_minima}) * \text{threshold\_ratio},$$

where global_maxima is the largest computed AMDF function AMDF($\tau$) value and global_minima is the smallest computed AMDF function AMDF($\tau$) value. The upper threshold and the lower threshold may optionally be scaled by a specified threshold ratio (threshold_ratio).

After computing the upper threshold and the lower threshold, the second stage 1160 may proceed. The second stage 1160 includes an optional computing of the AMDF function AMDF($\tau$) value for a value of $\tau$ (block 1161) and repeating the computing of the AMDF function AMDF($\tau$) values for remaining values of $\tau$ (block 1162). It may be possible to use the results from the computing of the AMDF function AMDF($\tau$) performed in the first stage 1155 (block 1156 and block 1157) rather than re-computing (block 1161 and block 1162). After computing the AMDF function AMDF($\tau$) value for a variety of $\tau$, the computed AMDF function AMDF($\tau$) values may be processed to search for distinctive peaks and nulls (block 1163). With distinctive peaks and nulls found, it may now be possible to compute the offset (block 1164). The processing of the computed AMDF function AMDF($\tau$) values may make use of the upper threshold and the lower threshold computed in the first stage 1155 to help prevent the erroneous detection of local minima and local maxima as distinctive peaks and distinctive nulls. For example, referring back to FIG. 4, the use of the upper threshold 450 and the lower threshold 455 may help prevent the selection of the local minima 425 and/or the local maxima 430 as a distinctive peak or a distinctive null. If there are not distinctive nulls, then there may not be an offset. After computing the offset (block 1164), the offset may be verified (block 1170).

FIG. 13 illustrates a sequence of events 1300 in the setting of operational parameters for an ADC. An ADC, such as the ADC 250, may have operational parameters such as sampling frequency, sampling phase, and so forth. The proper configuration of the operational parameters of the ADC 250 may have a significant impact on the overall performance (image quality, for example). The setting of operational parameters of the ADC 250 may begin with a setting of the operational parameters of the ADC 250 to a first group of settings (block 1305). This may be followed by a determining of an offset in a sampling frequency of an analog image signal and a sampling frequency used to time the sampling of the analog image signal (block 1310). For example, the sequence of events 600 may be used to determine the offset, wherein the determining of the offset may make use of the AMDF function AMDF($\tau$).

After determining the offset (block 1310), if there are more operational parameters to test (block 1315), another group of settings may be selected (block 1320), the ADC 250 may be set according to the selected group of settings (block 1325), and the determining of the offset (block 1310) may be repeated. If there are no more operational parameters to test (block 1315), then it may be possible to select from the tested groups of operational parameters, a group of operational parameters yielding the smallest offset (block 1330). With the group of operational parameters selected, the setting of the operational parameters of the ADC 250 may terminate.

Figure 14:
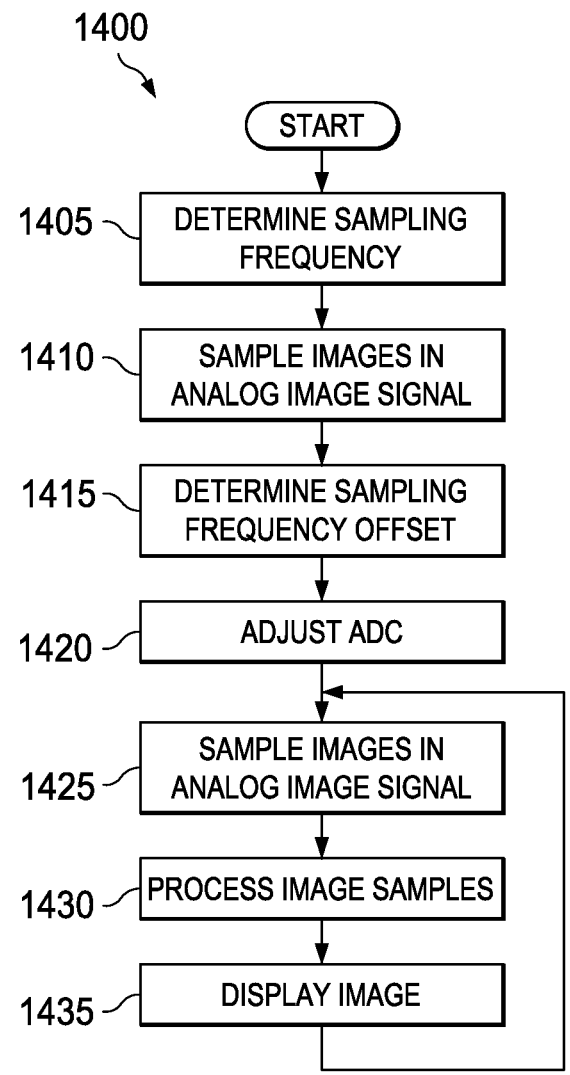
FIG. 14 is a diagram of a sequence of events in displaying an image.

FIG. 14 illustrates a sequence of events 1400 in the displaying of images. The sequence of events 1400 may be descriptive of events occurring in a digital display device displaying images from an analog image source. The displaying of images may begin with a determining of a sampling frequency that may be used to digitize the analog image signal (block 1405). A correct sampling frequency may be important in the proper display of the images from the analog image signal since an incorrect sampling frequency may result in a distorted image.

After the sampling frequency has been determined, the images from the analog image may be digitized (block 1410). The digitizing of the images may be performed by an ADC configured to sample the analog image signal at a sampling rate (the sampling rate may be defined as the inverse of the sampling frequency). To ensure that the analog image signal is being digitized properly, the sampling frequency of the ADC should match the analog image signal's sampling frequency with substantially no offset. Therefore, if there is an offset between the sampling frequency of the ADC and the analog image signal's sampling frequency, it may need to be detected and eliminated (or at least, reduced).

The offset (if present) may be detected by computing an AMDF function AMDF($\tau$) for various $\tau$ (delay), ranging from zero (0) to a maximum delay, $\tau_{max}$. The values of the AMDF function AMDF($\tau$) may be processed as discussed previously to determine the offset (block 1415). If there is an offset, the sampling frequency of the ADC may be adjusted (block 1420). The analog image signal may then be sampled (block 1425), processed (block 1430), and displayed (block 1435). The sampling, processing, and displaying of the analog image signal may continue while the digital display device is in operation.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method using image processing hardware for processing image frames of an analog input signal for displaying images, the method comprising:
    sampling the analog image signal at a sampling frequency provided by a reference clock signal to produce samples;
    computing values of an autocorrelation function using the samples and a delayed version of the samples for a range of delays;
    computing a sampling frequency offset from the values of the autocorrelation function; and
    adjusting the sampling frequency using the sampling frequency offset;
    wherein there are M samples, where M is an integer number, and wherein computing the values comprises computing values for a delay $\tau$, of an autocorrelation function expressible as:

$$\text{autocorrelation\_function}(\tau) = \sum_{i=0}^{M} |\text{difference\_function}(\text{sample}(i+\tau), \text{sample}(i))|,$$

where difference_function (x, y) computes a difference between x and y, and sample(i) is an i-th buffered sample.

2. The method of claim 1, wherein the samples are preconditioned prior to computing the set of values of the autocorrelation function; and wherein the preconditioning is selected from the group consisting of: clipping, histogram thresholding, computing a moving average, median filtering, phase shifting cancellation, and combinations thereof.

3. The method of claim 1, wherein the difference_function (sample(i+$\tau$), sample(i)) is an average magnitude difference function and is expressible as:

difference_function(sample(i+$\tau$), sample(i))=sample(i+$\tau$)−sample(i).

4. The method of claim 1, wherein the range of delays comprises a range starting at about zero (0) delay to a maximum delay.

5. The method of claim 4, wherein the maximum delay is less than or equal to M.

6. The method of claim 1, further comprising:
    computing second values of an autocorrelation function using the samples and a delayed version of the samples for the range of delays; and
    computing an upper threshold and a lower threshold from the computed second values of the autocorrelation function.

7. The method of claim 6, wherein the computing the sampling frequency offset further comprises using the upper threshold and the lower threshold.

8. The method of claim 1, further comprising:
    sampling the analog image signal at the adjusted sampling frequency to produce second samples;
    image processing the second samples; and
    displaying an image using the processed second samples.

9. A method using image processing hardware for processing image frames of an analog image signal for displaying images, the method comprising:
    sampling the analog image signal at the sampling frequency provided by a reference clock signal to produce first samples;
    computing values of an autocorrelation function with the samples and a delayed version of the samples for a range of delays;
    computing a sampling frequency offset from a non-zero delay value corresponding to a minimum of the values associated with a non-zero delay; and
    adjusting the sampling frequency in response to determining that there is a sampling frequency offset;
    wherein there are M samples, where M is an integer number, and wherein computing the values comprises computing values for a delay $\tau$, of an autocorrelation function expressible as:

$$\text{autocorrelation\_function}(\tau) = \sum_{i=0}^{M} |\text{difference\_function}(\text{sample}(i+\tau), \text{sample}(i))|,$$

where difference_function (x, y) computes a difference between x and y, and sample(i) is an i-th buffered sample.

10. The method of claim 9, wherein the difference_function (sample(i+τ), sample(i)) is an average magnitude difference function and is expressible as:

$$\text{difference\_function}(\text{sample}(i+\tau), \text{sample}(i)) = \text{sample}(i+\tau) - \text{sample}(i).$$

11. A method using image processing hardware for processing image frames of an analog image signal for displaying images, the method comprising:
sampling the analog image signal at the sampling frequency provided by a reference clock signal to produce first samples;
computing values of an autocorrelation function with the samples and a delayed version of the samples for a range of delays;
computing a sampling frequency offset from a non-zero delay value corresponding to a minimum of the values associated with a non-zero delay;
verifying the sampling frequency offset; and
adjusting the sampling frequency in response to determining that there is a sampling frequency offset;
wherein verifying the sampling frequency offset comprises:
sampling the analog image signal at the sampling frequency to produce second samples;
computing second values of an autocorrelation function with the second samples and a delayed version of the second samples for a range of delays;
computing a second sampling frequency offset from a non-zero delay value corresponding to a minimum of the set of second values associated with a non-zero delay;
determining the sampling frequency offset verified in response to a determining that the second sampling frequency offset and the sampling frequency offset are substantially equal;
computing a third sampling frequency offset from a non-zero delay value corresponding to a second minimum of the first values associated with a second non-zero delay; and
determining the sampling frequency offset verified in response to a determining that the third sampling frequency offset is substantially equal to an integer multiple of the sampling frequency offset.

12. The method of claim 11, further comprising, after the computing the sampling frequency offset, verifying the sampling frequency offset.

13. The method of claim 11, further comprising, after adjusting the sampling frequency, repeating computing the values of an autocorrelation function, computing the sampling frequency offset, and adjusting the sampling frequency until the sampling frequency offset is substantially equal to zero.

14. The method of claim 11, further comprising:
sampling the analog image signal at the adjusted sampling frequency to produce second samples;
image processing the second samples; and
displaying an image using the processed second samples.

15. A method using image processing hardware for processing image frames of an analog input signal for displaying images, the method comprising:
sampling the analog image signal at a sampling frequency provided by a reference clock signal to produce samples;
computing values of an autocorrelation function using the samples and a delayed version of the samples for a range of delays;
computing a sampling frequency offset from the values of the autocorrelation function; and
adjusting the sampling frequency using the sampling frequency offset;
wherein the autocorrelation function is an average magnitude difference function (AMDF);
wherein the computing the sampling frequency offset comprises:
searching for a minimum in the values of the AMDF function associated with a non-zero delay; and
computing the sampling frequency offset from the non-zero delay; and
wherein a unit delay is equal to a sampling period, and wherein the sampling frequency offset is expressible as:

$$\text{sampling\_frequency\_offset} = \left( \frac{\text{current\_sample\_period}}{\text{column\_width} * \text{loc\_first\_distinctive\_null}} \right),$$

where loc_first_distinctive_null is the location (value) of the minimum, current_sample_period is the sampling period of the sampling frequency used to sample the analog image signal, and column_width is a width of a column used in windowing.

16. A method using image processing hardware for processing image frames of an analog image signal for displaying images, the method comprising:
sampling the analog image signal at the sampling frequency provided by a reference clock signal to produce first samples;
computing values of an autocorrelation function with the samples and a delayed version of the samples for a range of delays;
computing a sampling frequency offset from a non-zero delay value corresponding to a minimum of the values associated with a non-zero delay; and
adjusting the sampling frequency in response to determining that there is a sampling frequency offset;
wherein the autocorrelation function is an average magnitude difference function (AMDF);
wherein the computing the sampling frequency offset comprises:
searching for a minimum in the values of the AMDF function associated with a non-zero delay; and
computing the sampling frequency offset from the non-zero delay; and
wherein a unit delay is equal to a sampling period, and wherein the sampling frequency offset is expressible as:

$$\text{sampling\_frequency\_offset} = \left( \frac{\text{current\_sample\_period}}{\text{column\_width} * \text{loc\_first\_distinctive\_null}} \right),$$

where loc_first_distinctive_null is the location (value) of the minimum, current_sample_period is the sampling period of the sampling frequency used to sample the analog image signal, and column_width is a width of a column used in windowing.

* * * * *